US009425781B2

(12) United States Patent
Nandy et al.

(10) Patent No.: US 9,425,781 B2
(45) Date of Patent: Aug. 23, 2016

(54) SYNCLESS UNIT INTERVAL VARIATION TOLERANT PWM RECEIVER CIRCUIT, SYSTEM AND METHOD

(71) Applicant: STMICROELECTRONICS INTERNATIONAL N.V., Amsterdam (NL)

(72) Inventors: Tapas Nandy, Delhi (IN); Anchal Jain, Greater Noida (IN)

(73) Assignee: STMICROELECTRONICS INTERNATIONAL N.V., Amsterdam (NL)

(*) Notice: Subject to any disclaimer, the term of this patent is extended or adjusted under 35 U.S.C. 154(b) by 155 days.

(21) Appl. No.: 14/231,133

(22) Filed: Mar. 31, 2014

(65) Prior Publication Data

US 2014/0292402 A1  Oct. 2, 2014

Related U.S. Application Data (60) Provisional application No. 61/806,516, filed on Mar. 29, 2013.

(51) Int. Cl.
*H03K 9/08* (2006.01)

(52) U.S. Cl.
CPC ...................... *H03K 9/08* (2013.01)

(58) Field of Classification Search
CPC ...................................................... H03K 9/08
USPC ................... 329/311, 312; 332/109; 375/238
See application file for complete search history.

(56) References Cited

U.S. PATENT DOCUMENTS

| 4,713,841 A | 12/1987 | Porter et al. |
| 5,424,668 A | 6/1995 | Kohsaka |
| 2007/0076792 A1* | 4/2007 | Ivanov ............... H03K 9/08 375/238 |
| 2007/0176706 A1* | 8/2007 | Kim ................ H03K 9/08 332/109 |
| 2009/0001946 A1* | 1/2009 | Mehas .............. H02M 1/36 323/266 |
| 2012/0133417 A1* | 5/2012 | Darzy ............... G06G 7/161 327/337 |

FOREIGN PATENT DOCUMENTS

EP   0600624   6/1994

OTHER PUBLICATIONS

Jain et al., "A Low Power 1.2Gbps Sync-less Integrating PWM Receiver," 2013 IEEE Asian Solid-State Circuits Conference, pp. 229-232, Nov. 2013.

* cited by examiner

*Primary Examiner* — Jeffrey Shin
(74) *Attorney, Agent, or Firm* — Seed IP Law Group PLLC (57) ABSTRACT

A PWM receiver circuit receives and demodulates pulse width modulated (PWM) data signals without requiring synchronization such that no synchronization preamble need be provided with the PWM data signal. Embodiments may consume less power since there is no need to repeatedly synchronize a PLL, counter or other circuitry to the PWM data signal. Furthermore, the PWM receiver circuit operates in view of or is "tolerant" to jitter in the frequency of the PWM signal and also to a relatively wide range of intentional variation in the frequency. Interleaved operation of parallel PWM receiver circuits are utilized in some embodiments. In one embodiment currents are integrated during low and high portions of the duty cycle of the PWM data signal and the difference in the respective voltages generated through such integration used to demodulate the PWM data signal.

26 Claims, 6 Drawing Sheets

SYNCLESS UNIT INTERVAL VARIATION TOLERANT PWM RECEIVER CIRCUIT, SYSTEM AND METHOD

PRIORITY CLAIM

The present application claims the benefit of U.S. Provisional Patent Application No. 61/806,516, filed Mar. 29, 2013, which application is incorporated herein by reference in its entirety.

TECHNICAL FIELD

The present disclosure relates generally to data communications, and more specifically to capturing a pulse width modulated (PWM) data input signal.

BACKGROUND

The Mobile Industry Processor Interface (MIPI) Alliance is a collaboration of mobile industry leaders having the objective of defining and promoting open standards for interfacing with mobile application processors. A mobile application processor is typically a system-on-a-chip (SoC) that executes applications in a mobile operating system environment. The MIPI Alliance establishes specifications for standard hardware and software interfaces in mobile processing environments to speed deployment of new services to mobile users. In such mobile processing environments, data is communicated between and among chips forming the SoC over high speed serial links. While this high speed serial data must be communicated, there is also a need for low speed and low power communication over these same data links, such as to transfer link management information, lower priority or speed-critical data, and possibly other types of low speed data as well.

Different ways or protocols for communicating this serial data have been proposed and utilized, such as protocols including a data clock or data strobe accompanying the data being communicated as well as self-clocking protocols (i.e., no separate data clock or strobe) like Pulse Width Modulation (PWM) and Pulse Width and Amplitude Modulated (PWAM). In many of these prior approaches, a phase-locked loop (PLL) or delay-locked loop (DLL) in both a transmitter transmitting the data and in a receiver receiving the data are required. In one such situation, a mobile physical layer (M-PHY) standard communicates pulse width modulated data signals, with the duty cycle of each pulse width modulated signal determining whether a binary 1 or a binary 0 is being communicated. In the present description the acronym PWM is utilized to refer to both the terms "pulse width modulation" and "pulse width modulated."

One prior approach of sensing or demodulating these PWM data signals being communicated according to the M-PHY standard is to utilize a counter to generate a count value when the PWM data signal is high and a count value when the PWM data signal is low, and to compare the two counts to determine whether the PWM signal is communicating a binary 1 or a binary 0. An up/down counter could also be utilized. With this approach, however, the frequency of a clock signal that clocks the counter, or the number of phases of the clock signal, may need to be eight or more times higher than the frequency of the PWM data signal. For example, if the duty cycle of the PWM data signal may go as low as ¼ (0.25) the period or unit interval (UI) of the data signal then the clock signal would need to be twice the frequency of this signal (2×(1/(¼UI))) or eight times the frequency (1/UI) of the PWM data signal. Circuitry to generate this clock signal may consume relatively large amounts of power. Moreover, the clock signal must be synchronized with the PWM data signal so the PWM data signal must include a synchronizing preamble. Some applications, however, require that no such preamble be utilized due to bandwidth constraints. Another approach utilizes a phase locked loop (PLL) to lock onto the PWM data signal and to then appropriately sample the PWM data signal. These PLLs may consume relatively large amounts of power and also require relatively complex circuitry. Another technique is to use an analog integrator to extract the middle of a data clock period for use in data extraction, but such an approach also may consume a relatively large amount of power. Accordingly, there is a need for improved techniques of reliably capturing serial PWM data signals.

SUMMARY

In an embodiment of the present disclosure, a PWM receiver circuit operates to receive and demodulate pulse width modulated (PWM) data signals without require synchronization so no synchronization preamble need be provided with the PWM data signal. Some embodiments will consume less power, at least in particular situation. For example, during burst-then-stall intermittent communications through such PWM data signals, there is no need to repeatedly synchronize a PLL, counter or other circuitry to the PWM data signal, which would otherwise be necessary when synchronization is required. The PWM receiver circuit also does not need to generate a local clock signal from the PWM signal, such as through sampling the PWM data signal. Furthermore, the PWM receiver circuit operates in view of or is "tolerant" to jitter in the frequency of the PWM signal and also to a relatively wide range of intentional variation in the frequency. In one embodiment the PWM receiver circuit can tolerate a change in frequency of the PWM data signal of up to three times. Interleaved operation of parallel PWM receiver circuits are also utilized in other embodiments.

DETAILED DESCRIPTION

Figure 1A:
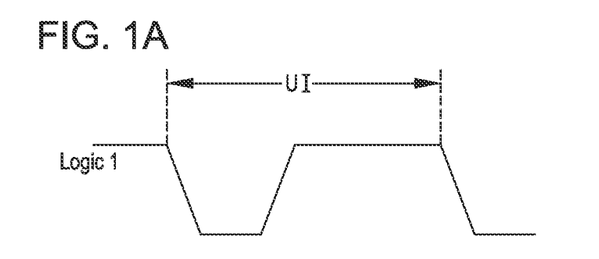
FIGS. 1A and 1B are signal timing diagrams illustrating a PWM data signal modulated to contain a logic 1 in FIG. 1A and modulated to contain a logic 0 in FIG. 1B.
Figure 1B:
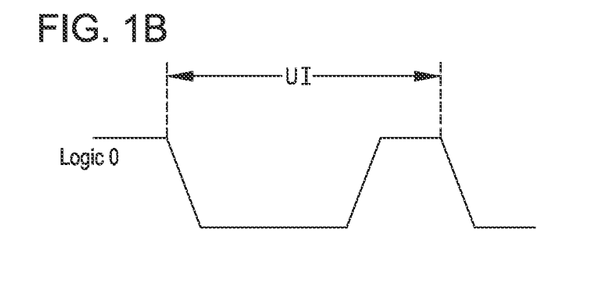

FIGS. 1A and 1B are signal timing diagrams illustrating a PWM data signal modulated to contain a logic 1 in FIG.

1A and modulated to contain a logic 0 in FIG. 1B. The period T of the PWM data signal is indicated as a unit interval UI in the figures. The duty cycle of the PWM data signal changes depending on whether a binary logic 1 or a logic 0 is being transmitted during a given unit interval UI of the PWM data signal. For example, when a logic 1 is being communicated as shown in FIG. 1A, the duty cycle is ⅔, with the ⅓ low portion of the data signal coming at the start of the unit interval UI and followed by the ⅔ high portion of the data signal. When a logic 0 is being communicated as shown in FIG. 1B, the duty cycle is ⅓, with the ⅔ low portion of the data signal coming at the start of the unit interval UI and followed by the ⅓ high portion of the data signal. The duty cycle may vary from unit interval UI to unit interval, and may vary from application to application. A minimum allowable duty cycle is specified for given applications, such as ¼ of the unit interval UI, and indicates the minimum permissible duty cycle below which the PWM data signal may not fall to ensure proper demodulation of the data signal.

In the present description, certain details are set forth in conjunction with the described embodiments of the present disclosure to provide a sufficient understanding of the disclosure. One skilled in the art will appreciate, however, that embodiments of the disclosure may be practiced without these particular details. Furthermore, one skilled in the art will appreciate that the example embodiments described herein do not limit the scope of the present disclosure to only such embodiments, and will also understand that various modifications, equivalents, and combinations of the disclosed embodiments and components of such embodiments are within the scope of the present disclosure. Embodiments including fewer than all the components of any of the respective described embodiments may also be within the scope of the present disclosure although not expressly described in detail below. Finally, the operation of well-known components and/or processes has not been shown or described in detail below to avoid unnecessarily obscuring the present disclosure. Also note that the terms "PWM data signal" and "PWM signal" are used interchangeably herein, and are meant to indicate a signal that is pulse width modulated to communicate any type of information. Thus, the term "data" includes data, control, and any other type of information that may be communicated via the pulse width modulation of the signal.

Figure 2:
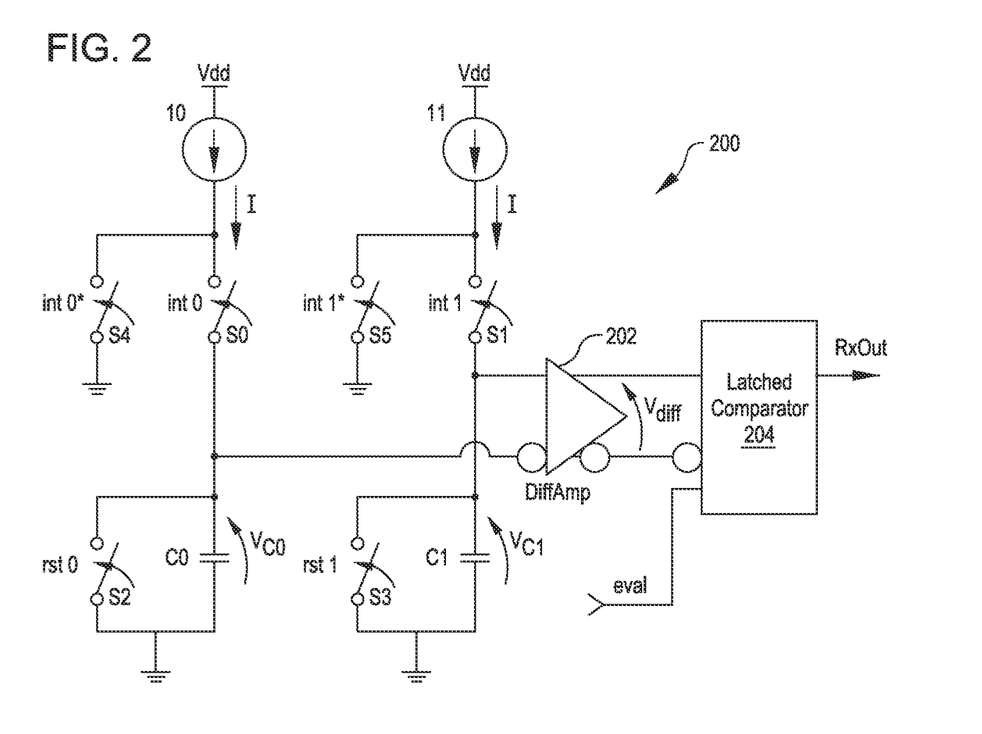
FIG. 2 is a schematic and functional block diagram of a PWM receiver circuit according to one embodiment of the present disclosure.

Referring now to FIG. 2, a schematic and functional block diagram of a PWM receiver circuit 200 according to one embodiment of the present disclosure is illustrated. The PWM receiver circuit 200 includes a first constant current source I0 coupled in series with a first switch S0 and a first capacitor C0 between a supply voltage VDD and ground, and a second constant current source I1 coupled in series with a second switch S1 and a second capacitor C1 between the supply voltage and ground. In operation, the switches S0 and S1 are controlled by integration signals int0 and int1 generated responsive to edges of the received PWM data signal to integrate the constant currents provided by the current sources I0 and I1, respectively, via the capacitors C0 and C1 during the low and high portions of the PWM data signal, and in this way develop voltages VC0 and VC1 across the capacitors C0 and C1 that are then used to demodulate the PWM data signal, as will be explained in more detail below.

The PWM receiver circuit 200 further includes switches S2 and S3 coupled in parallel across the capacitors C0 and C1 to discharge to voltages VC0 and VC1 across the capacitors to a desired reference value responsive to reset signals rst0 and rst1, respectively. The reference value is ground in the embodiment of FIG. 2 but could be some other value in other embodiments. A switch S4 is coupled to the node defined at the interconnection of the current source I0 and switch S0 to discharge this node responsive to a complementary integration signal int0*, which is active when the switch S0 is open responsive to the int0 signal being inactive. This ensures that charge does not build up on this node and that such charge is not transferred to the capacitor C0 when the switch S0 is again closed, which could result an erroneous value for the voltage VC0. For the same reason, a switch S5 is coupled to the node defined at the interconnection of the current source I1 and switch S1 to discharge this node responsive to an active complementary integration signal int1*, which occurs when the switch S1 is open responsive to the int1 signal being inactive. Note the switches S0 and S4 receive complementary control signals int0 and int0* so that when the int0 signal is inactive to turn OFF the switch S0 then the int0* signal is active to turn ON the switch S4, and vice versa. The same is true for the switches S1 and S5, which receive complementary control signals int1 and int1*, in relation to the current source I1 and capacitor C1. Note the switches S0-S5 may be formed through any suitable circuit, and in one embodiment each of these switches is either an NMOS or a PMOS transistor.

A differential amplifier 202 has inputs coupled to the capacitors C0 and C1 and operates to generate a differential voltage Vdiff responsive to these voltages, where the differential voltage Vdiff=VC1−VC0. A latched comparator 204 receives the differential voltage Vdiff and operates, in response to an evaluation signal eval, to generate a data output signal RxOut having a value that is determined by the differential voltage. The value of the data output signal RxOut indicates whether the PWM data signal being demodulated is communicating a logic 0 or a logic 1, as will be described in more detail below with reference to FIG. 3. In the PWM receiver circuit 200, the current sources I0 and I1 are matched currents sources that each provide the same current I to charge the corresponding capacitor C0 and C1. The capacitors C0 and C1 too are matched capacitors having equal values. The term "matched" is understood by those skilled in the art to mean components that are identical or nearly identical. For example, the current sources I0, I1 provide approximately the same or substantially the same current I, where any differences are extremely small so as to not adversely affect the operation of the circuit 200. The current sources I0, I1 have substantially the same operating characteristics as well, where an example of such an operating characteristic is a temperature coefficient of the current I, and in this way any variation in the current I over temperature will be the same for each current source.

In operation, the PWM receiver circuit 200 integrates the constant current I from the current source I0 over the low period or portion of the received PWM data signal and integrates the current I from the current source I1 over the high period or portion of the PWM data signal. The PWM data signal has a period or unit interval UI as discussed with reference to FIGS. 1A and 1B, and over the low portion of the unit interval (i.e., the time during which the PWM data signal is low) the constant current I from the current source I0 is integrated through the capacitor C0, and over the high portion of the unit interval (i.e., the time during which the PWM data signal is high) the constant current I from the current source I1 is integrated through the capacitor C1. As a result, at the end of the unit interval UI, the voltages VC0 and VC1 across the capacitors C0 and C1 have values that together indicate whether the PWM data signal is communicating a logic 1 or a logic 0. More specifically, the sign of the difference of the voltages (VC1–VC0) determines whether the PWM data signal is communicating a logic 1 or a logic 0. This is true because when the PWM data signal has a higher duty cycle (i.e., when the high portion of the signal is greater than the low portion as shown in FIG. 1A), the voltage VC1 is greater than the voltage VC0 at the end of the unit interval UI, and accordingly a logic 1 will be decoded or demodulated by the PWM receiver circuit 200. Conversely, when the PWM data signal has lower duty cycle (i.e., when the low portion of the signal is greater than the high portion as shown in FIG. 1B), the voltage VC1 is less than the voltage VC0 at the end of the unit interval UI, and accordingly a logic 0 will be decoded or demodulated by the PWM receiver circuit 200.

In operation of the PWM receiver circuit 200, the current I is integrated through the capacitors C0 and C1 for the low and high portions of the PWM data signal and the voltages are stored or held on these capacitors for comparison by the latched comparator 204 after the unit interval has elapsed since the unit interval is required to generate the two voltages VC0 and VC1. This approach has the advantage over charging and discharging of a single capacitor during the two phases or portions of the PWM data signal because the charging and discharging currents of such a single capacitor are difficult to match so that they are equal. This is true because with MOS technology, charging of the single capacitor would typically be done using a PMOS transistor while discharging would typically be done using an NMOS transistor. The differences between such NMOS and PMOS devices inherently makes it difficult to match the charge and discharge currents where a single capacitor used.

The differential amplifier 202 generates the differential voltage Vdiff having a sign indicating whether the PWM data signal is communicating a logic 1 or a logic 0. This differential voltage Vdiff is output by the amplifier 202 and provided to the latched comparator 204. In one embodiment, the latched-comparator 204 is formed by a sense amplifier type latch (i.e., NMOS and PMOS transistors forming cross-coupled inverters to thereby form the latch) followed by an SR latch for storing the data output signal RxOut.

Figure 3:
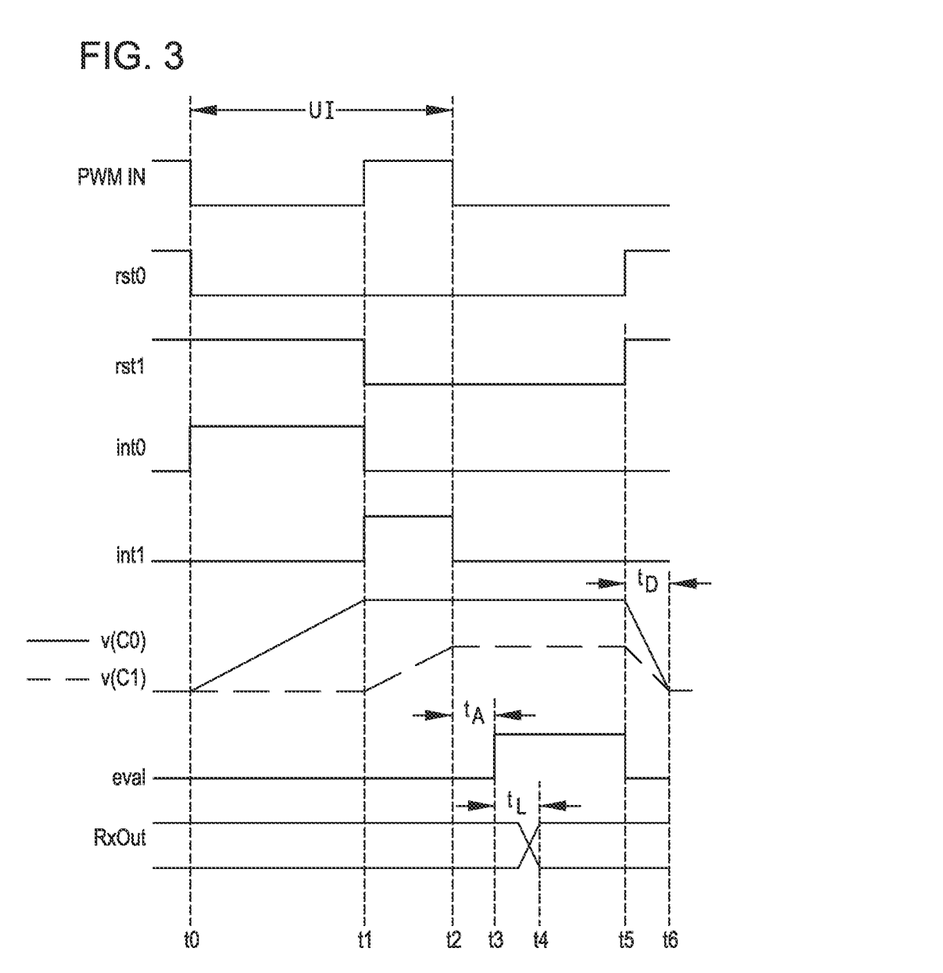
FIG. 3 is a timing diagram illustrating several signals in the PWM receiver circuit of FIG. 2 during operation of this circuit.

FIG. 3 is a timing diagram illustrating signals in the PWM receiver circuit of FIG. 2 during the above-described operation of the circuit. The PWM data signal input to the PWM receiver circuit 200 is in the form of a low voltage differential signal (LVDS) where the PWM receiver circuit is being used to decode or demodulate signals being communicated according to the M-PHY standard of the MIPI alliance. In this situation, LVDS signal would be converted to a CMOS level signal through an LVDS limiting amplifier (not shown in FIG. 2) to thereby generate the PWM_IN signal shown in FIG. 3. The PWM_IN signal thus corresponds to the PWM data signal discussed above with reference to FIGS. 1 and 2, and as used in the below description as well. The PWM_IN signal is effectively used as a clock to control the operation of the PWM receiver circuit 200 in generating the data output signal RxOut. Also note that control circuitry (not shown in FIG. 2) generates the control signals illustrated in FIG. 3 to control operation of the PWM receiver circuit 200. One skilled in the art will understand suitable circuitry that may be utilized to generate these control signals and thus, for the sake of brevity and so as to not obfuscate the present disclosure, the detailed structure of this control circuitry is not described in more detail herein.

In operation, the PWM data signal (PWM_IN) goes low at a time t0 to initiate operation of the PWM receiver circuit 200 in the modulating a single bit encoded by the signal over a unit interval UI of the signal. Also assume initially that the reset signals switches S2-S5 are closed (i.e., reset signals rst0, rst1 and complementary integration signals int0*, int1* are active high) and thus the voltages VC0 and VC1 across capacitors C0 and C1 are at (i.e. at ground) initially. In response to the PWM_IN signal going low at time t0, the reset signal rst0 goes low opening the switch S2. In addition, the low edge of the PWM_IN signal causes the complementary integration signal int0* (not shown in FIG. 3) to go in active low, opening the switch S4, and causes the integration signal int1 to go active high closing the switch S0 to thereby couple the current source 10 to the capacitor C0. As seen in FIG. 3, this results in charging of the capacitor C0 with the current I from the current source I0 at time t0 and this charging results in the voltage VC0 beginning to increase at time t0.

This charging of the capacitor C0 and increase of the voltage VC0 continues during the low portion of the unit interval UI until a time t1 at which the PWM_IN signal goes high. In response to this rising edge of the PWM_IN signal at the time t1, the integration signal int0 goes inactive low, opening the switch S03 and terminating the charging of the capacitor C0. As seen in FIG. 3, the generated voltage VC0 across the capacitor C0 is maintained after the time t1, as will be described in more detail below. The complementary integration signal int0* (not shown) also transitions active high at the same time to thereby close the switch S4. Also, in response to this rising edge of the PWM_IN signal at the time t1, the reset signal rst1 goes inactive low, opening the switch S3 to allow charging of the capacitor C1. The integration signal int1 also goes active high at the time t1, closing the switch S1 and thereby coupling the current source I1 to the capacitor C1. The int1 signal (not shown) also goes inactive low at the time t1 opening the switch S5. The charging of the capacitor C1 with the current I from the current source I1 starts at time t1 and this charging results in the voltage VC1 (dotted line) beginning to increase at time t1.

This charging of the capacitor C1 and increase of the voltage VC1 continues during the high portion of the unit interval UI until a time t2 at which time the PWM_IN signal again goes low, indicating the end of the unit interval. At this point, the voltage VC1 across the capacitor C1 is maintained as is the voltage VC0 across the capacitor C0. The differential amplifier 202 (FIG. 2) generates the differential voltage Vdiff in response to the voltages VC1 and VC0, where Vdiff=(VC1–VC0). This differential voltage Vdiff is input to the latched comparator 204 (FIG. 2). At a time t3, which occurs an delay time to of the differential amplifier 202 after the PWM_IN signal goes low at time t2, the eval signal goes high, causing the latched comparator 204 (FIG. 2) to generate at a time t4 the data output signal RxOut having a value indicating a logic 0 or a logic 1 for the PWM_IN signal over the unit interval UI. The time t4 is a delay time tL of the latched comparator 204 after the set signal goes active at t3. In the example of FIG. 2, the RxOut signal would indicate the PWM_IN signal communicates a logic 0 (see FIG. 1B) over the unit interval UI. Note the time t4 is a set up time TL after the time t3 when the eval signal goes active high, and corresponds to the time needed for the latched comparator 204 to generate the RxOut signal and for this signal to be sufficiently settled or set up so that it can be reliably read by an external circuit (not shown) coupled to receive the RxOut signals.

The eval signal stays active high until a time t5, at which time the eval signal goes inactive low to terminate operation of the latched comparator 204. In addition, at the time t5 the reset signals rst0 and rst1 go active high to turn on the switches S2 and S3, respectively, and thereby discharge the capacitors C0 and C1. This is seen in FIG. 3 through the voltages VC0 and VC1 across the capacitors C0 and C1 decreasing starting at the time t5 until they are discharged a discharge time tD later at a time t6, where tD is the discharge time of the capacitors C0, C1. After the time t6, the PWM receiver circuit 200 is ready to decode or demodulate the PWM_IN signal over another unit interval UI of the signal.

The control signals shown in FIG. 3 control the discharge of capacitors C0 and C1 through the signals rst0 and rst1 respectively. The integration of the currents I0, I1 on the capacitors C0, C1 is controlled by the int0 and int1 signal, respectively, as just described, and the latching of the difference of integrated voltages, Vdiff=VC1−VC0, is controlled by the eval signal.

The common mode voltage VCM, of the voltages VC0 and VC1 varies with the duration of the unit interval UI as follows:

$$VCM = \frac{I \times UI}{2 \times C} \quad (1)$$

The value C represents the value of each of the capacitors C0 and C1. This common mode voltage VCM results in a rail to rail common mode input capable differential amplifier being used in one embodiment of the differential amplifier 202. The differential voltage Vdiff also changes with the duration of the unit interval UI and variation of the duty cycle of the PWM input. When the duty cycle approaches 50%, the differential voltage Vdiff may become very small, making it potentially difficult to decode or demodulate via the latched comparator 204. As a result, in one embodiment the value of the integrating current I (i.e., current provided by current sources I0 and I1) and value of the capacitors is chosen to maintain the following relation:

$$Vdiff = \frac{I \cdot |\Delta T|}{C} \geq \frac{Voffset\_latch}{AV\_amp} + Voffset\_amp \quad (2)$$

where, Voffset_latch is the sum of offset and the required input overdrive of the latched comparator, and Voffset_amp and AV_amp are an input referred offset voltage and a voltage gain of the differential amplifier, respectively, and the term ΔT is the difference of major and minor duration (major duration is larger of low or high portion of the PWM_IN signal and the minor duration is the smaller of the low or high portion) of a unit interval UI and is given by the following equation:

$$\Delta T = 2 \cdot \frac{Duty\_Cycle\_In \% - 50}{100} \cdot UI \quad (3)$$

Other factors that may be utilized in selecting values for the integrating current I and capacitors C0, C1 include accommodating variation of absolute time due to the variation of the unit interval UI and the variation of the duty cycle of the PWM_IN signal caused by degradation over the transmission line and jitter of the transmission circuit. This is done by limiting the integrated voltages VC0, VC1 across capacitors C0, C1 over the maximum minor duration of the degraded PWM_IN signal below the value of the supply voltage Vdd as indicated below:

$$\frac{I \cdot Tminor\_max}{C} \leq Vdd - Vdiff \quad (4)$$

To address various PWM gears as specified in the M-PHY standard, in one embodiment of the circuit 200 the integrating currents I and the gain bandwidth of the differential amplifier 202 are programmable. "Gears" correspond to different bit rates, data rates or speeds at which the PWM_IN signal may be communicated and multiple gears may be provided pursuant to the M-PHY specification. While gears up to G7 are defined in the M-PHY specification it is expected that gears up to G5 will be more widely used. Once the integrating current I and gain of the amplifier 202 are programmed for a particular gear, the PWM receiver circuit 200 in one embodiment is capable of handling up to a three times peak-to-peak variation of the unit interval UI by using the design equations (1)-(4) above. The PWM receiver circuit 200 is also able to demodulate a logic 1 from a PWM_IN signal with a duty cycle between 75% and 60%, and similarly is able to demodulate a logic 0 from a PWM_IN signal with a duty cycle between 25% and 40%.

Figure 4:
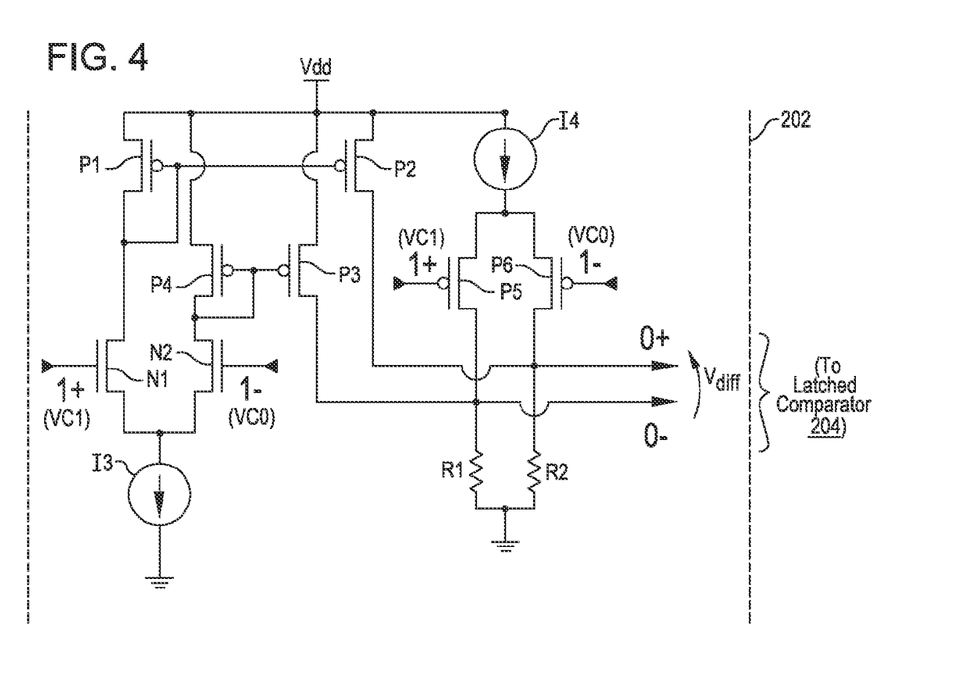
FIG. 4 is more detailed schematic of one embodiment of the differential amplifier of FIG. 2.

FIG. 4 is more detailed schematic of one embodiment of the differential amplifier 202 of FIG. 2. The amplifier 202 is a rail-to-rail common mode input capable differential amplifier and includes a number of NMOS transistors N1-N2, PMOS transistors P1-P6, resistors R1, R2, and current sources I3, I4 coupled as shown between the supply voltage Vdd and ground. A pair of the NMOS transistors N1, N2 and a pair of the PMOS transistors P5 receive the inputs to the amplifier 202, which are the voltages VC0 and VC1 across the capacitors C0 and C1, respectively. The amplifier 202 generates outputs O+, O− in response to the input voltages VC0 and VC1 and these outputs are applied as the differential voltage Vdiff to the latched comparator 204 (FIG. 2).

Referring back to FIG. 3, there is a need to hold the charges on the capacitors C0, C1 for the times (tA+tL), to amplify it via differential amplifier 202, to resolve or decode the differential voltage via the latched comparator 204. Then at time t5 after the RxOut signal has been output, the capacitors C0, C1 must be discharged fully, which takes some more time (tD, from t5 to t6) before the next integration phase of the PWM receiver circuit 200 can be initiated. The "integration" phase" corresponds to the times from t0-t6 in FIG. 3 and thus the next unit interval UI of the PWM_IN signal cannot begin to be demodulated until just after the time t6. The time interval t0-t6 is long enough, however, that before this time elapses for a given unit interval UI being demodulated, the next unit interval of the PWM_IN signal has started. In other words, the interval (t0-t6) is greater than the unit interval UI, which of course must be true since the entire unit interval UI is needed to integrate current I on capacitors C0, C1 for the low and high portions of the PWM_IN signal. As a result, the next integration phase (i.e., integration of the next unit interval UI of the PWM_IN signal) must be done with a separate set of capacitors C0, C1, differential amplifier 202, and latched comparator 204, namely with a separate PWM receiver circuit 200. This means that a time interleaving technique may be employed with several PWM receiver circuits 200 that operate in an interleaved manner to demodulate successive unit intervals UI of the PWM_IN signal.

Figure 5:
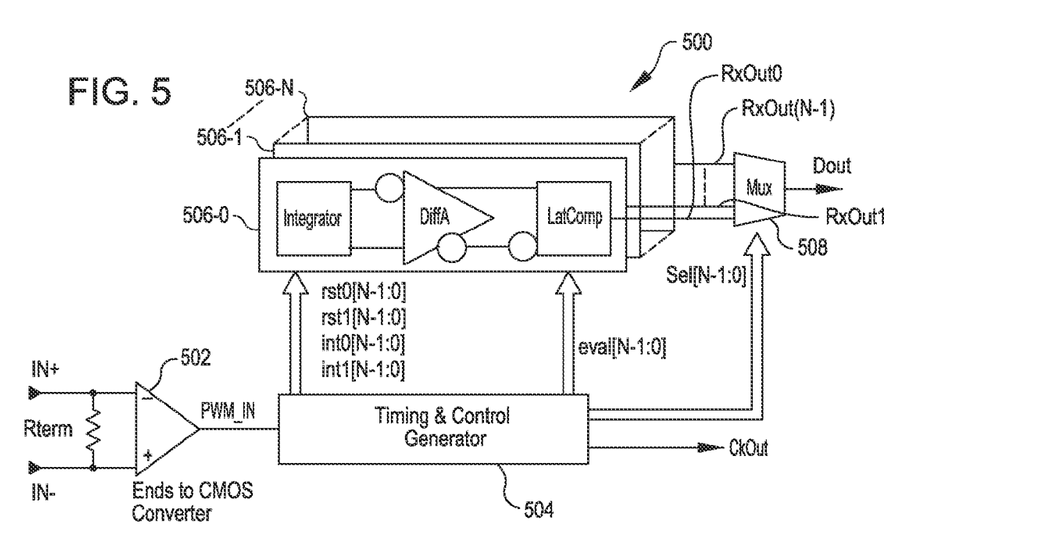
FIG. 5 is functional block diagram of an interleaved PWM receiver circuit according to another embodiment of the present disclosure.

FIG. 5 is functional block diagram of an interleaved PWM receiver circuit 500 according to another embodiment of the present disclosure. In this embodiment, a LVDS-to-CMOS converter receives the LVDS input signal and converts this to the PWM_IN signal, as discussed above. The PWM_IN signal is then applied to a timing and control generator circuit 504 which, in response to the PWM_IN signal, generates a number of control signals to control the overall operation of the circuit 500. The PWM_IN signal functions as a clock signal to clock the generator circuit 504, as will be explained in more detail below. The generator circuit 504 includes a number of receiver stages 506-0 to 506-(N−1), where each stage corresponds to the PWM receiver circuit 200 of FIG. 2. Thus, N is a number that determines the number of receiver stages 506 in the interleaved PWM receiver circuit 500, and the number N varies in different embodiments of the present disclosure. In response to the PWM_IN signal, which as mentioned above clocks the generator circuit 504, the generator circuit generates the required control signals rst0[N−1:0], rst1[N−1:0], int0[N−1:0], int0*[N−1:0], int1[N−1:0], int1*[N−1:0], and eval[N−1:0] to control the operation of these receiver stages 506 in an interleaved manner. A multiplexer 508 receives the data output signals RxOut1 to RxOutn form the stages 506-0 to 506-(N−1) and the generator circuit 504 also generates multiplexer selection signals Sel[N−1:0] to select which of these output signals is provided by the multiplexer as the output of the interleaved PWM receiver circuit 500. The timing and control generator circuit 504 may be formed using counters, such as a ring counter, and state machines, and delays operating responsive to the PWM_IN signal being used as a clock signal to clock the generator circuit, and thus for the sake of brevity, the generator circuit 504 will not be described in more detail herein. The generator circuit 504 also outputs a clock output signal CkOut, which is a delayed version of the PWM_IN signal, and thus the outputs generated by the interleaved PWM receiver circuit 500 are the selected output RxOut from the selected stage and the CkOut signal.

The required number N of interleaved stages 506 is determined by the following equation, rounded off to the next higher integer:

$$Nstage = \text{ceiling} \frac{tA + tL + tD}{UImin} + 1 \quad (5)$$

where the time to is the delay time of the differential amplifier 202, the time tL is the delay time of the latched comparator 204, the time tD is the discharge time of the capacitors C0, C1, and the value UImin is the minimum target unit interval UI for a given gear of operation. In one embodiment, three stages 506-0, 506-1, 506-2 (i.e., N=3) of time interleaving are found to be sufficient for the highest data rate, PWM-Gear-7 of the M-PHY specification.

Figure 6:
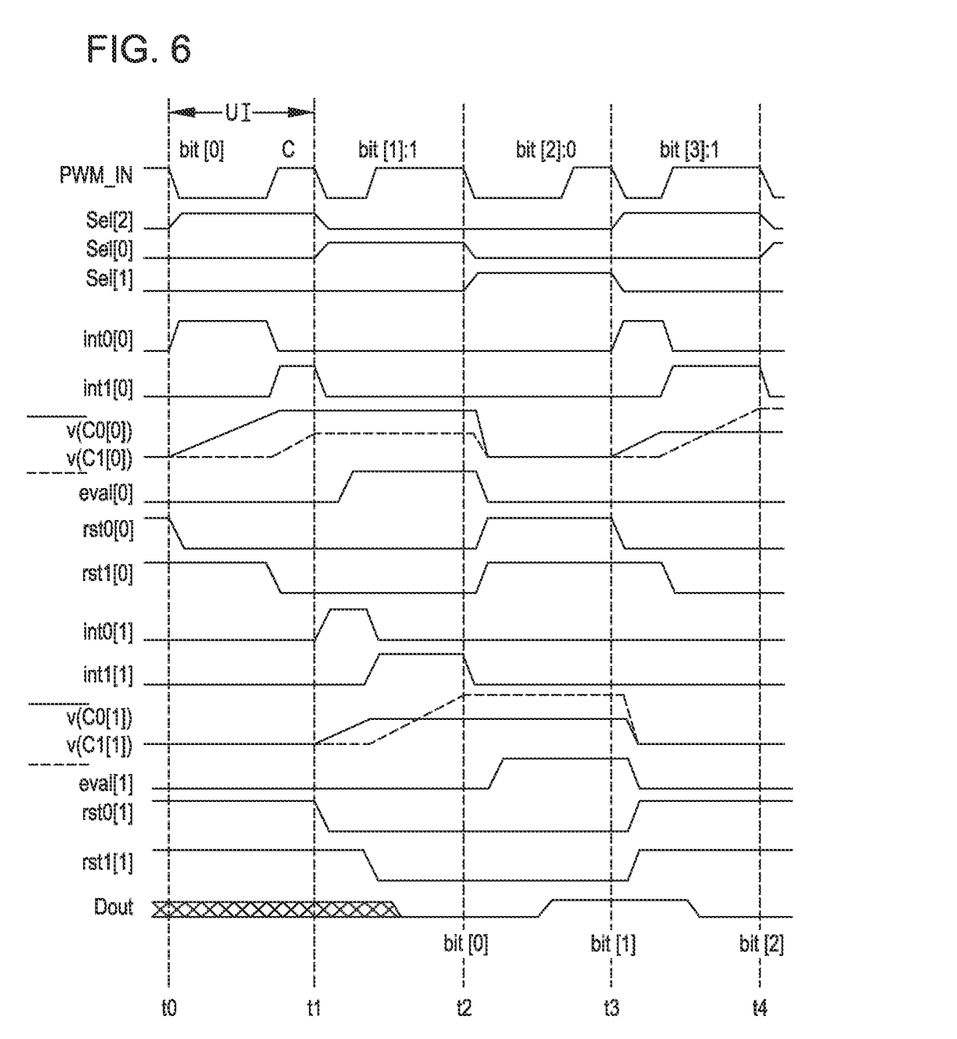
FIG. 6 is a signal timing diagram illustrating several signals in the interleaved PWM receiver circuit of FIG. 5 during operation of this circuit.

FIG. 6 is a signal timing diagram illustrating the control signals in the interleaved PWM receiver circuit 500 of FIG. 5 during operation of this circuit. As seen in this timing diagram, the select signals, Sel[2:0] (i.e., Sel[N−1:0] and N=3 so Sel[3−1:0]) are generated from the falling edges of the PWM_IN signal as seen for the Sel[2] signal at time t1, the Sel[0] signal at time t1, and the Sel[1] signal at time t2. This naming convention is skewed by one unit interval UI, namely the 0th PWM bit (i.e., the PWM_IN signal during the 0th unit interval (t0-t1) and designated bit[0] in FIG. 6) generates the Sel[2] signal. The 1st PWM bit (i.e., the PWM_IN signal during the second unit interval (t1-t2) and designated bit[1] in FIG. 6) generates the Sel[0] signal. The 2nd PWM bit (i.e., the PWM_IN signal during the third unit interval (t2-t3) and designated bit[2] in FIG. 6) generates the Sel[1] signal. The operation of the circuit 500 continues cyclically in this manner and this way the decoded or demodulated RxOut0 for bit 0 is output from the multiplexer 508 out when the Sel[0] signal is high. Referring to FIG. 6, the Sel[0] signal goes high at time t1 and the bit[0] is output a short time later and by time t2. The Sel[1] signal goes high at time t2 and the bit[1] is output a short time later and by time t3, and in the same way the Sel[2] signal goes high at time t3 and the bit[2] is output a short time later and by time t4. In operation, the control generator circuit 504 generates these select signals Sel[2:0] responsive to the incoming PWM_IN signal and generates the remainder of the controls signals rst0[N−1:0], rst1[N−1:0], int0[N−1:0], int0*[N−1:0], int1[N−1:0], int1*[N−1:0], and eval[N−1:0] from the Sel[2:0] signals, PWM_IN signal and delayed versions thereof. The voltage signals VC0[i]) and VC1[i] represent the voltages are across the integrating capacitors C0, C1 (see FIG. 2) of ith receiver circuit stage, and are shown for the first receiver stage 506-0 (VC0[0], VC1[0]) and the second receiver stage 506-1 (VC0[1], VC1[1]). FIG. 6 thus shows the difference between the integration voltages VC0[0], VC1[0] in the receiver stage 506-0 while receiving PWM bit 0 (time t0-t1) and in the receiver stage 506-1 while receiving the PWM bit 1 (time t1-t2). The discharge of these integration voltages VC0, VC1 for each of the stages 506-0 and 506-1 are also seen in FIG. 6. In FIG. 6 only control signals and integrating voltages for two stages 506-0 and 506-1 are shown by way of example. The same signals for the third receiver stage 506-2 can be derived easily from the timing diagram of FIG. 6 and will be understood by those skilled in the art. In addition, the demodulation of a second PWM bit 3 (time t3-t4) by the receiver stage 506-0 starting at time t3 is also seen in FIG. 6. This illustrates that with the three receiver stages 506-0, 506-1, and 506-2 the PWM_IN signal (i.e., PWM bits) can be demodulated in real time with the interleaved PWM receiver circuit 500.

The operation of the PWM receiver circuit 200 of FIG. 2 and interleaved PWM receiver circuit 500 of FIG. 5 illustrate that each of these embodiments has a very useful characteristic for demodulating the PWM_IN signal. Every PWM data bit (i.e., the PWM_IN signal over each unit interval UI) is separately extracted during the unit interval UI for that bit, and thus variation of the unit interval UI over consecutive PWM data bits is tolerable. The embodiment of FIG. 5 with three receiver stages 506-0, 506-1, 506-2 can tolerate three times the variation in consecutive unit intervals and still demodulate each bit. Thus, the jitter requirement of a clock of the driving a PWM transmitter that providing the PWM_IN signal is relaxed to a great extent. A very crude oscillator in the PWM transmitter thus may suffice, which is allowed to vary over process, unclean supply voltage, and temperature, up to three times in duration of a nominal unit interval UI.

In addition, with the circuits 200 and 500 there is no need to "lock" onto the incoming bit stream (i.e., the PWM_IN signal). It is much faster, typically a few 100 nS, to turn on the current sources I0, I1, the differential amplifier 202, and the latched comparator 204, this it takes for a PLL or a DLL to "lock," as will be appreciated by those skilled in the art. Thus, switching between power down and normal data burst modes of reception is faster than in PWM receivers using a PLL or DLL. This results in a substantial reduction in the average power consumption of the receiver 200/500 when bursts of data are sent interspersed with sleep modes (not data) of operation. Finally, note that the retrieved clock (CkOut) from the interleaved PWM receiver circuit 500 is equally varying as the PWM_IN signal, but this does not matter as long as a correct depth of a first-in-first-out (FIFO) buffer is chosen in the next higher level (LINK layer) of serial communication to transfer received data (RxOut0 to RxOutN) to a processor for subsequent processing.

Figure 7:
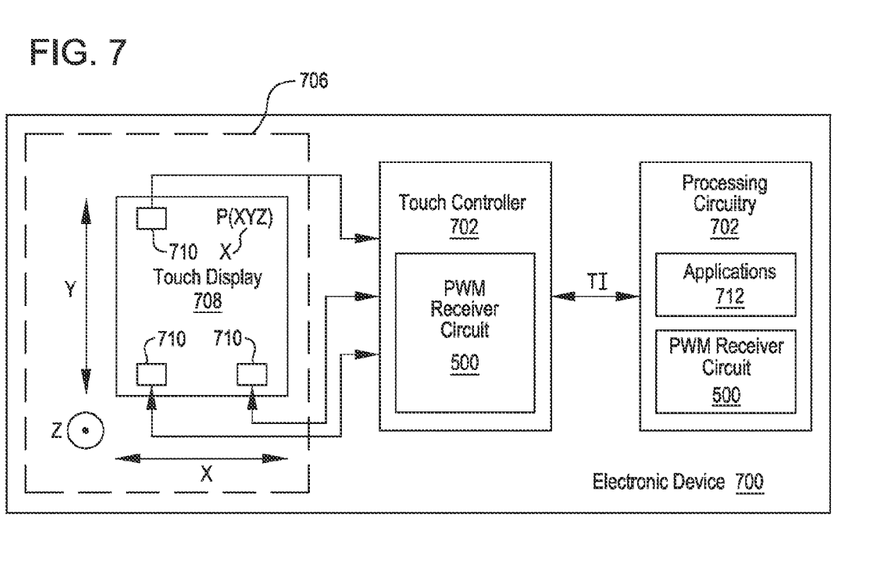
FIG. 7 is a functional block diagram of an electronic system including the interleaved PWM receiver circuit of FIG. 5 according to one embodiment of the present disclosure.

FIG. 7 is a functional block diagram of an electronic system or device 700 including or more of the interleaved PWM receiver circuit 500 of FIG. 5 according to one embodiment of the present disclosure. The electronic device 700 also may include one or more of the PWM receiver circuit 200 of FIG. 2. The electronic device 700 includes processing circuitry 702 coupled to a touch controller 704 that controls a touch screen 706 to detect touches or touch points P(X,Y,Z) applied on or above a touch panel 708 of the touch screen. In this way a user (not shown) of the electronic device 700 interfaces with and controls the operation of the electronic device. The electronic system or device 700 may be any type of electronic system, such as a computer system, a tablet computer, a smart phone, a portable music or video player, and so on. For the present description, the electronic device 700 is assumed to be a smart phone by way of example.

The touch display 708 may be a liquid crystal display (LCD), and also includes a number of touch sensors 710 positioned on the touch display to detect touch points P(X,Y,Z), with only three touch sensors being shown merely by way of example and to simply the figure. There are typically many more touch sensors 710, as will be appreciated by those skilled in the art. These touch sensors 710 are usually contained in a transparent sensor array that is then mounted on a surface of the touch display 708. The number and locations of the sensors 710 can vary as can the particular technology or type of sensor, with typical sensors being resistive, vibration, capacitive, or ultrasonic sensors. In the embodiment of FIG. 7, the sensors are considered to be capacitive sensors by way of example.

In operation of the touch screen 706, a user (not shown) generates a touch point P(X,Y,Z) through a suitable interface input, such as a touch event, hover event, or gesture event, using either his or her finger or an input device, such as an intelligent input device like an active stylus. The terms touch event, hover event, and gesture event will now be briefly described. A touch event is an interface input where the user's finger or input device is actually touching the surface of the touch display 708, while hover and gesture events the user's finger or input device is within a sensing range above the surface of the touch display but is not touching the surface of the display. In a hover event the finger or input device may be stationary or moving while in a gesture event the finger or intelligent input device is moving in a singular or a plurality of predefined motions or constraints. The X-axis, Y-axis, and Z-axis are shown in FIG. 7 with the Z-direction being out of the page and orthogonal to the surface (i.e., the XY plane) of the touch display 708. Thus, for a given touch point P(X,Y,Z), the X and Y values indicate the location of the touch point on the surface of the touch display 708 while the Z value indicates the distance of the user's finger or input device from the surface, or simply whether the input device or finger is within the sensing range (Z=0 for touch events) from the surface.

In response to a touch point P(X,Y,Z), the sensors 710 generate respective signals that are provided to the touch controller 704 which, in turn, processes these signals to generate touch information TI for the corresponding touch point. The touch information TI that the touch controller 704 generates for each touch point P(X,Y,Z) includes location information and event information identifying the type of interface input, namely whether the touch point P(X,Y,Z) corresponds to a touch event, hover event, gesture event, or some other type of event recognized by the touch controller. The location information includes an X-coordinate and a Y-coordinate that together define the XY location of the touch point P(X,Y,Z) on the surface of the touch display 708.

Where the sensors 710 are capacitive sensors, the sensors are typically formed as an array of sensors from transparent patterned orthogonal conductive lines (not shown) formed on the surface, or integrated as part of, the touch display 708. The intersections of the conductive lines form individual sensors or "sensing points," and the touch controller 704 scans these sensing points and processes the generated signals to identify the location and type of touch point or points P(X,Y,Z). The detailed operation of such an array of capacitive sensors 710 and the touch controller 708 in sensing the location and type of touch point P(X,Y,Z) will be understood by those skilled in the art, and thus, for the sake of brevity, will not be described in more detail herein.

The processing circuitry 702 is coupled to the touch controller 704 to receive the generated touch information TI, including the location of the touch point P(X,Y,Z) and the corresponding type of detected interface event (touch event, hover event, gesture event) associated with the touch point. The processing circuitry 704 executes applications or "apps" 712 that control the electronic device 700 to implement desired functions or perform desired tasks. These apps 712 executing on the processing circuitry 702 interface with a user of the electronic device 700 through the touch controller 704 and touch screen 706, allowing a user to start execution of or "open" the app and to thereafter interface with the app through the touch display 708.

The processing circuitry 702 represents generally the various types of circuitry contained in the electronic device 700 other than the touch screen 706 and touch controller 704. Where the electronic device 700 is a smart phone, for example, the processing circuitry 702 would typically include a processor, memory, Global Positioning System (GPS) circuitry, Wi-Fi circuitry, Bluetooth circuitry, and so on. The processing circuitry 702 also includes the interleaved PWM receiver circuit 500 for communicating with components within the electronic device 700 or external to the electronic device. The touch controller 704 is also shown as including the interleaved PWM receiver circuit 500, and thus in the example of FIG. 7 the processing circuitry 702 and touch controller 704 could communicate with either through a serial communications link over which PWM_IN data signals are communicated as described above in detail with reference to FIGS. 106.

Even though various embodiments and advantages of the present disclosure have been set forth in the foregoing description, the present disclosure is illustrative only, and changes may be made in detail and yet remain within the broad principles of the present disclosure. Moreover, the functions performed by various components described above can be combined to be performed by fewer elements, separated and performed by more elements, or combined into different functional blocks depending upon the nature of the electronic system to which the present disclosure is being applied, as will be appreciated by those skilled in the art. At least some of the components described above may be implemented using either digital or analog circuitry, or a combination of both, and also, where appropriate, may be realized through software executing on suitable processing circuitry. It should also be noted that the functions performed by various components discussed above can be combined and performed by fewer elements or separated and performed by additional elements depending on the nature of the electronic device 700. Therefore, the scope of protection for the present disclosure is to be defined and limited only by the appended or subsequently submitted claims.

What is claimed is:

1. A method of demodulating a pulse width modulation signal, comprising:
   receiving the pulse width modulation signal, the pulse width modulation signal having first and second levels;
   charging, by a first current source, a first capacitor in response to the pulse width modulation signal changing from the first level to the second level during a first time interval;
   charging, by a second current source, a second capacitor in response to the pulse width modulation changing from the second level to the first level during the first time interval; and
   demodulating the pulse width modulation signal for the first time interval based on voltages of the first and second capacitors.

2. The method of claim 1, wherein a sign of the difference between the voltages of the first and second capacitors indicates whether the pulse width modulate signals is communicating a logic 0 or a logic 1 during the first time interval.

3. The method of claim 1, wherein the pulse width modulation signal includes successive time intervals, the method further including interleaving the receiving of the pulse width modulation signal, the charging of the first capacitor, and the charging of the second capacitor, and demodulating the pulse width modulation signal for each of the successive time intervals.

4. The method of claim 1, wherein the receiving of the pulse width modulation signal includes:
   receiving a low voltage differential signal; and
   generating the pulse width modulation signal by converting the low voltage differential signal to a CMOS level signal.

5. The method of claim 1, wherein the charging of the first capacitor includes generating a first current and the charging of the second capacitor includes generating a second current, the first and second currents being independently generated and matched currents.

6. The method of claim 1, further comprising:
   discharging the first and second capacitors subsequent to the demodulation of the pulse width modulation signal.

7. The method of claim 1, further comprising:
   disconnecting the second current source from the second capacitor in response to the pulse width modulation signal changing from the first level to the second level during the first time interval; and
   disconnecting the first current source from the first capacitor in response to the pulse width modulation signal changing from the second level to the first level during the first time interval.

8. The method of claim 1, wherein the charging of the first capacitor includes providing a first current to the first capacitor, and the charging of the second capacitor includes providing a second current to the second capacitor, the first current being substantially the same as the second current.

9. The method of claim 1, further comprising holding a charge of the first capacitor during the charging of the second capacitor.

10. A circuit, comprising:
    a first capacitor;
    a second capacitor;
    a receiving circuit configured to receive an input signal carrying a data value and having first and second levels;
    a first current source configured to charge the first capacitor in response to the input signal changing from the second level to the first level;
    a second current source configured to charge the second capacitor in response to the input signal changing from the first level to the second level; and
    a first comparator circuit configured to demodulate the input signal and recover the data value based on a voltage of the first capacitor and a voltage of the second capacitor.

11. The circuit of claim 10, wherein the voltage of the first capacitor has a first magnitude that is related to a time during which the input signal has the first level, and the voltage of the second capacitor has a second magnitude that is related to a time during which the input signal has the second level.

12. The circuit of claim 10, wherein the first current source is configured to charge the first capacitor while the input signal has the first level, and the second current source charges the second capacitor while the input signal has the second level.

13. The circuit of claim 10, wherein the first and second current sources are configured to charge the first and second capacitors, respectively, during a first cycle of the input signal, the demodulation circuit further including:
    a third current source configured to charge a third capacitor in response to the input signal changing from the second level to the first level during a second cycle of the input signal that is subsequent to the first cycle;
    a fourth current source configured to charge a fourth capacitor in response to the input signal changing from the first level to the second level during the second cycle of the input signal; and
    a second comparator circuit configured to recover another data value based on a voltage of the third capacitor and a voltage of the fourth capacitor.

14. The demodulation circuit of claim 10, wherein the first capacitor has a first maximum capacitance, and the second capacitor has a second maximum capacitance that is substantially equal to the first maximum capacitance.

15. The demodulation circuit of claim 10, further comprising:
    a first switch coupled between the first current source and the first capacitor, the first switch configured to disconnect the first current source from the first capacitor in response to the input signal changing from the first level to the second level; and
    a second switch coupled between the second current source and the second capacitor, the second switch configured to disconnect the second current source from the second capacitor in response to the input signal changing from the second level to the first level during the first time interval.

16. A system, comprising:
    a receiving circuit configured to receive an input signal carrying a plurality of data values, the input signal having first and second levels;
    a plurality of demodulation circuits, each of the plurality of demodulation circuits including:
    a first capacitor;
    a second capacitor;

a first current source configured to charge the first capacitor in response to the input signal changing from the first level to the second level;

a second current source configured to charge the second capacitor in response to the input signal changing from the second level to the first level; and a comparator circuit configured demodulate the input signal and recover a data value of the plurality of data values based on voltages of the first and second capacitors.

17. The system of claim 16, wherein each of the plurality of demodulation circuits includes a microprocessor or a microcontroller.

18. The system of claim 16, wherein the plurality of demodulation circuits are disposed on a same die.

19. The system of claim 16, further comprising:
a control circuit configured to select a first demodulation circuit of the plurality of demodulation circuits to demodulate the input signal for a first time interval, and select a second demodulation circuit of the plurality of demodulation circuits to demodulate the input signal for a second time interval that is subsequent to the first time interval.

20. The system of claim 16, wherein first and second demodulation circuits of the plurality of demodulation circuits are disposed on respective dies.

21. A method:
receiving an input signal carrying a first data value during a first time interval, the input signal having first and second levels;

charging, by a first current source, a first capacitor for a duration of time in which the input signal is at the first level during the first time interval;

charging, by a second current source, a second capacitor for a duration of time in which the input signal is at the second level during the first time interval; and demodulating the input signal for the first time interval by recovering the first data value based on a voltage of the first capacitor and a voltage of the second capacitor.

22. The method of claim 21, wherein the voltage of the first capacitor has a first magnitude that is related to the time during which the input signal has the first level, and the voltage of the second capacitor has a second magnitude that is related to the time during which the input signal has the second level.

23. The method of claim 21, wherein the input signal carries a second data value during a second time interval, the method further including:
charging, by a third current source, a third capacitor for a duration of time in which the input signal is at the first level during the second time interval; and charging, by a fourth current source, a fourth capacitor for a duration of time in which the input signal is at the second level during the second time interval; and recovering the second data value based on a voltage of the third capacitor and a voltage of the fourth capacitor.

24. The method of claim 21, wherein the recovering of the first data value includes:
determining the first data value is a logic zero value in response to the voltage of the first capacitor being greater than the voltage of the second capacitor; and determining the first data value is a logic one value in response to the voltage of the first capacitor being less than the voltage of the second capacitor.

25. A method, comprising:
receiving a signal having first and second levels, the signal having the first level and the second level during a first time interval, the signal having the first level and the second level during a second time interval subsequent to the first time interval;

charging a first capacitor while the signal is at the first level during the first time interval;

charging a second capacitor while the signal is at the second level during the first time interval;

holding a voltage of the first capacitor and a voltage of the second capacitor during the second time interval; and demodulating the signal for the first time interval by determining a first data value based on a difference between the voltage of the first capacitor and the voltage of the second capacitor.

26. The method of claim 25, further comprising:
charging a third capacitor while the signal is at the first level during the second time interval;

charging a fourth capacitor while the signal is at the second level during the second time interval; and demodulating the signal for the second time interval by determining a second data value based on a difference between a voltage of the third capacitor and a voltage of the fourth capacitor.

* * * * *